(12) United States Patent
Kim et al.

(10) Patent No.: US 9,209,146 B2
(45) Date of Patent: Dec. 8, 2015

(54) ELECTRONIC DEVICE PACKAGES HAVING BUMPS AND METHODS OF MANUFACTURING THE SAME

(71) Applicant: SK hynix Inc., Icheon-si Gyeonggi-do (KR)

(72) Inventors: Seung Jee Kim, Seongnam-si (KR); Qwan Ho Chung, Seoul (KR); Jong Hyun Nam, Seoul (KR); Si Han Kim, Yongin-si (KR); Sang Yong Lee, Icheon-si (KR); Seong Cheol Shin, Daegu (KR)

(73) Assignee: SK Hynix Inc., Gyeonggi-do (KR)

( * ) Notice: Subject to any disclaimer, the term of this patent is extended or adjusted under 35 U.S.C. 154(b) by 5 days.

(21) Appl. No.: 14/532,393

(22) Filed: Nov. 4, 2014

(65) Prior Publication Data
US 2015/0056755 A1 Feb. 26, 2015

Related U.S. Application Data

(62) Division of application No. 13/618,813, filed on Sep. 14, 2012, now Pat. No. 8,907,487.

(30) Foreign Application Priority Data

Jun. 13, 2012 (KR) .................... 10-2012-0063202

(51) Int. Cl.
*H01L 23/00* (2006.01)
*H01L 23/498* (2006.01)
(Continued)

(52) U.S. Cl.
CPC ............. *H01L 24/11* (2013.01); *H01L 21/768* (2013.01); *H01L 23/49827* (2013.01); *H01L 23/5389* (2013.01); *H01L 24/03* (2013.01); *H01L 24/05* (2013.01); *H01L 24/19* (2013.01); *H01L 24/83* (2013.01); *H01L 21/56* (2013.01); *H01L 23/3121* (2013.01); *H01L 24/13* (2013.01); *H01L 2224/02333* (2013.01); *H01L 2224/02351* (2013.01); *H01L 2224/02372* (2013.01); *H01L 2224/02379* (2013.01); *H01L 2224/0346* (2013.01); *H01L 2224/03334* (2013.01); *H01L 2224/03472* (2013.01); *H01L 2224/03474* (2013.01); *H01L 2224/03903* (2013.01); *H01L 2224/03906* (2013.01); *H01L 2224/0401* (2013.01); *H01L 2224/04105* (2013.01); *H01L 2224/05017* (2013.01); *H01L 2224/05026* (2013.01); *H01L 2224/05144* (2013.01); *H01L 2224/05147* (2013.01); *H01L 2224/05548* (2013.01); *H01L 2224/05567* (2013.01); *H01L 2224/05624* (2013.01); *H01L 2224/05644* (2013.01); *H01L 2224/05647* (2013.01); *H01L 2224/1184* (2013.01);
(Continued)

(58) Field of Classification Search
None
See application file for complete search history.

(56) References Cited

U.S. PATENT DOCUMENTS 4,555,052 A * 11/1985 Kurtz et al. .................... 228/104
5,413,952 A * 5/1995 Pages et al. .................... 438/406
(Continued)

*Primary Examiner* — Bilkis Jahan
*Assistant Examiner* — Kevin Quinto
(74) *Attorney, Agent, or Firm* — William Park & Associates Ltd.

(57) ABSTRACT

An electronic device package includes a bump having a post disposed on a contact portion of a semiconductor chip and an enlarged portion laterally protruded from an upper portion of the post; an interconnection portion having a locking portion that substantially surrounds the enlarged portion and an upper sidewall of the post; and a dielectric layer substantially surrounding the bump and the locking portion to separate the interconnection portion from the semiconductor chip.

15 Claims, 12 Drawing Sheets

(51) Int. Cl.
*H01L 23/538* (2006.01)
*H01L 21/768* (2006.01)
*H01L 23/31* (2006.01)
*H01L 21/56* (2006.01)

(52) U.S. Cl.
CPC ............... *H01L 2224/11334* (2013.01); *H01L 2224/11602* (2013.01); *H01L 2224/12105* (2013.01); *H01L 2224/131* (2013.01); *H01L 2224/13022* (2013.01); *H01L 2224/211* (2013.01); *H01L 2224/32225* (2013.01); *H01L 2224/73267* (2013.01); *H01L 2224/92244* (2013.01); *H01L 2924/00014* (2013.01); *H01L 2924/15311* (2013.01); *H01L 2924/181* (2013.01)

(56) References Cited

U.S. PATENT DOCUMENTS

| | | | | |
|---|---|---|---|---|
| 6,495,916 | B1* | 12/2002 | Ohuchi et al. | 257/737 |
| 2002/0090814 | A1* | 7/2002 | Inoue et al. | 438/672 |
| 2003/0219926 | A1* | 11/2003 | Yuzawa | 438/106 |
| 2011/0179640 | A1* | 7/2011 | Arnold et al. | 29/825 |

* cited by examiner

ELECTRONIC DEVICE PACKAGES HAVING BUMPS AND METHODS OF MANUFACTURING THE SAME

CROSS-REFERENCES TO RELATED APPLICATIONS

The present application claims priority under 35 U.S.C. 119(a) to Korean Application No. 10-2012-0063202, filed on Jun. 13, 2012, in the Korean intellectual property Office, which is incorporated herein by reference in its entirety.

BACKGROUND

1. Technical Field

Embodiments of the present disclosure generally relate to package technology, to electronic device packages having bumps, and methods of manufacturing the same.

2. Related Art

Electronic devices employed in electronic systems may include various circuit elements such as active elements and/or passive elements. The circuit elements may be integrated in and/or on a semiconductor substrate, thereby constituting the electronic device (also, referred to as a semiconductor chip or a semiconductor die). The electronic device may be mounted on a printed circuit board (PCB) or a package substrate to produce an electronic device package. The package substrate may include circuit interconnections such as silicon interposers. The electronic device package may be mounted on a main board to constitute the electronic systems, for example, computers, mobile systems, or data storage media.

Bumps are widely used in the fabrication of the electronic device packages. The bumps may electrically connect the electronic devices to the package substrates or may electrically connect the electronic devices to each other. For example, the bumps may be employed in flip chip packages to realize diverse stack structures of semiconductor chips and/or to increase the number of input/output terminals.

As the semiconductor chips having chip pads become more highly integrated, pitches and sizes of the chip pads have been gradually reduced and sizes of the bumps formed on the chip pads have also been reduced. In addition, the highly integrated semiconductor chips may lead to reduction of pitches and sizes of pads of package substrates, which are electrically connected to the bumps formed on the chip pads. Accordingly, contact areas between the fine bumps and the fine pads may be abruptly reduced.

Moreover, thin packages are increasingly in demand with the development of higher performance electronic systems. Thus, it may be necessary to reduce the thicknesses of the semiconductor chips, the package substrates and/or mold layers encapsulating the semiconductor chips. However, if the thicknesses of the semiconductor chips, the package substrates and/or mold layers encapsulating the semiconductor chips are reduced, the semiconductor chips and/or the package substrates may be more readily warped due to differences between coefficients of thermal expansion of the package substrates and the semiconductor chips. As a result, a physical stress applied to interfaces between the bumps and the pads may be increased to cause the bumps to peel from the pads. Accordingly, the reliability of the semiconductor packages (e.g., the electronic device packages) may be degraded.

SUMMARY

Various embodiments are generally directed to electronic device packages having substantially 'T'-shaped bumps and methods of manufacturing the same.

According to various embodiments, an electronic device package includes a bump having a post disposed on a contact portion of a semiconductor chip and an enlarged portion laterally protruded from an upper portion of the post; an interconnection portion having a locking portion that substantially surrounds the enlarged portion and an upper sidewall of the post; and a dielectric layer substantially surrounding the bump and the locking portion to separate the interconnection portion from the semiconductor chip.

In various embodiments, the bump including the post and the enlarged portion may have a substantially hammer-shaped configuration.

In some embodiments, the bump may include a first metal material and the locking portion of the interconnection portion may include a second metal material different from the first metal material.

In various embodiments, the bump may include gold or copper and the locking portion of the interconnection portion may include copper.

According to various embodiments, an electronic device package includes a semiconductor chip mounted on a bottom dielectric layer, a bump having a post disposed on a contact portion of the semiconductor chip and an enlarged portion laterally protruded from an upper portion of the post, a dielectric layer embedding the semiconductor chip and exposing the enlarged portion of the bump and an upper sidewall of the post, and an interconnection portion having a locking portion that substantially surrounds the enlarged portion of the bump and the upper sidewall of the post and a connecting portion that extends from the locking portion onto the dielectric layer.

According to various embodiments, a method of manufacturing an electronic device package includes forming a first dielectric layer that substantially surrounds a semiconductor chip having a contact portion. The first dielectric layer has an opening that exposes an upper sidewall of a post disposed on the contact portion and exposes an enlarged portion laterally protruded from an upper portion of the post. An interconnection portion is formed to include a locking portion that substantially surrounds the enlarged portion and the exposed upper sidewall of the post. The post and the enlarged portion constitute a bump, and the interconnection portion is formed to extend onto the first dielectric layer.

In various embodiments, the method may further include mounting the semiconductor chip onto a second dielectric layer prior to formation of the first dielectric layer.

According to various embodiments, a method of manufacturing an electronic device package includes forming a post on a contact portion of a semiconductor chip, forming a first dielectric layer substantially covering the semiconductor chip, removing a portion of the first dielectric layer to form an opening that exposes an upper portion of the post, forming an enlarged portion that is disposed on the post to laterally protrude from a sidewall of the post, and forming an interconnection portion on the first dielectric layer. The interconnection portion is formed to have a locking portion that substantially fills the opening to substantially cover the enlarged portion and an upper sidewall of the post. The post and the enlarged portion constitute a bump.

In various embodiments, the method may further include mounting the semiconductor chip on a second dielectric layer prior to formation of the post.

In various embodiments, the method may further include mounting the semiconductor chip with the post on a second dielectric layer prior to formation of the first dielectric layer.

In various embodiments, forming the enlarged portion may include attaching a ball to a top surface of the post using a wire bonding apparatus, separating the ball from a wire produced by the wire bonding apparatus, and flattening the ball.

In various embodiments, forming the interconnection portion may include forming a conductive layer that substantially fills the opening using a plating process.

In various embodiments, forming the first dielectric layer may include laminating a dielectric film on the semiconductor chip. In this case, the method may further include laminating a seed layer having a foil form on the dielectric film after the dielectric film is laminated on the semiconductor chip.

In various embodiments, forming the first dielectric layer may include disposing a dielectric film with a seed layer over the semiconductor chip, and laminating the dielectric film on the semiconductor chip.

In various embodiments, forming the interconnection portion may include forming a conductive layer substantially filling the opening on the first dielectric layer using a plating process, and pattering the conductive layer.

In various embodiments, the bump may be formed to include a first metal material and the interconnection portion may be formed to include a second metal material different from the first metal material.

According to various embodiments, a method of manufacturing an electronic device package includes forming a bump having a post disposed on a contact portion of a semiconductor chip and an enlarged portion laterally protruded from an upper portion of the post, forming a dielectric layer on the semiconductor chip, removing a portion of the dielectric layer to form an opening that exposes the enlarged portion and an upper sidewall of the post under the enlarged portion, and forming an interconnection portion on the dielectric layer. The interconnection portion is formed to have a locking portion that substantially fills the opening to substantially cover the enlarged portion and the upper sidewall of the post.

In various embodiments, forming the bump may include forming the post on the contact portion of the semiconductor chip, attaching a ball to a top surface of the post using a wire bonding apparatus, separating the ball from a wire produced by the wire bonding apparatus, and flattening the ball to form the enlarged portion.

In various embodiments, forming the bump may include forming a first resist pattern on the semiconductor chip. The first resist pattern may be formed to have a first hole exposing the contact portion of the semiconductor chip. The first hole may be filled with a conductive layer to form the post. A second resist layer may be formed on the post. The second resist layer may be patterned to form a second hole that exposes the post and has a greater width than the post. The second hole may be filled with a conductive layer to form the enlarged portion.

BRIEF DESCRIPTION OF THE DRAWINGS

Embodiments of the inventive concept will become more apparent in view of the attached drawings and accompanying detailed description, in which.

DETAILED DESCRIPTION

Figure 1:
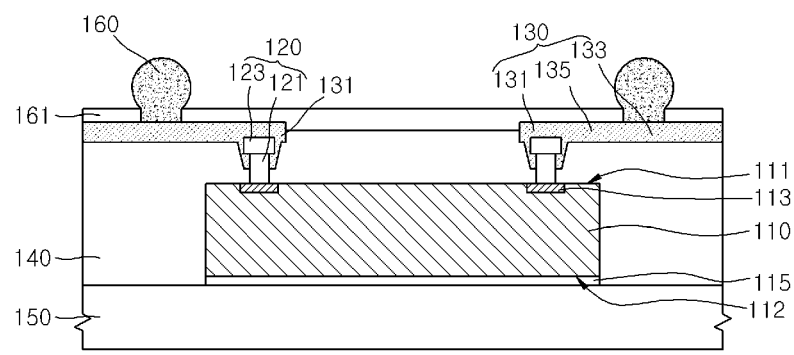
FIGS. 1 and 2 are cross sectional views illustrating electronic device packages according to various embodiments.

Various embodiments will be described hereinafter with reference to the accompanying drawings.

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. As used herein the term "and/or" includes any and all combinations of one or more of the associated listed items. Additionally, the same reference numerals or the same reference designators may denote the same elements throughout the specification.

It will be also understood that when an element is referred to as being located "under", "beneath," "below", "lower," "on", "over", "above," "upper", "side" or "aside" another element, it can be directly contact the other element, or at least one intervening element may also be present therebetween. Accordingly, the terms such as "under", "beneath," "below", "lower," "on", "over", "above," "upper", "side" "aside" and the like which are used herein are for the purpose of describing particular embodiments only and are not intended to limit the inventive concept.

It will be further understood that the term "semiconductor chip" used herein may correspond to a semiconductor die or a semiconductor substrate including a DRAM circuit or a flash memory circuit. Moreover, it will be understood that the term "contact portion" used herein may correspond to a conductive member for electrical connection, for example, an interconnection pad or a landing pad. In addition, the term "bump" used herein may correspond to an electrical connection member or a bonding member and may also be expressed as a stud or a post that is utilized in the art to which these embodiments belong.

Figure 2:
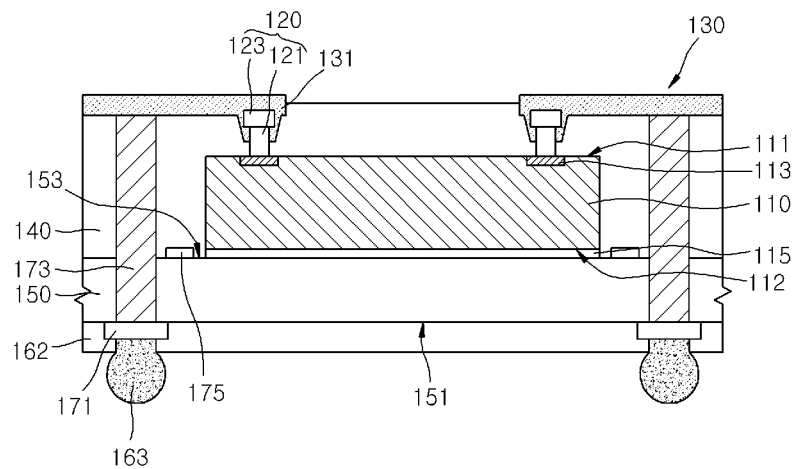

FIGS. 1 and 2 are cross sectional views illustrating electronic device packages according to various embodiments.

Referring to FIG. 1, an electronic device package according to an embodiment may include a semiconductor chip 110 having a top surface 111, and a bottom surface 112. Contact portions 113 may be disposed on the top surface 111 of the semiconductor chip 110, and bumps 120 may be disposed on respective ones of the contact portions 113. The contact portions 113 may correspond to chip pads that electrically connect the semiconductor chip 110 to an external device or system. When integrated circuits constituting the semiconductor chip 110 are formed on and/or under active surfaces located at the top surface 111, the contact portions 113 may be electrically connected to the integrated circuits of the semiconductor chip 110. In such a case, the contact portions 113 may be electrically connected to the integrated circuits of the semiconductor chip 110 through redistributed lines (not illustrated).

In various embodiments, when the active surfaces on which the integrated circuits constituting the semiconductor chip 110 are formed and are located at the bottom surface 112 of the semiconductor chip 110, the contact portions 113 on the top surface 111 may be electrically connected to the integrated circuits of the semiconductor chip 110 by through silicon vias (TSVs; not illustrated) vertically penetrating the semiconductor chip 110.

The semiconductor chip 110 may correspond to a memory chip or a logic chip. The memory chip may include, for example, a DRAM circuit or a flash memory circuit, and the logic chip may include, for example, a control circuit.

Each of the bumps 120 on the contact portions 113 may have a protrusion that substantially horizontally or laterally extends from a body thereof. For example, each of the bumps 120 may have a substantially hammer-shaped configuration or a 'T'-shaped configuration. In an embodiment, each of the bumps 120 may be configured to include a post 121 that vertically extends from one of the contact portions 113 and an enlarged portion 123 that laterally extends from a top portion of the post 121. When the bumps 120 are combined with interconnection portions 130 which are disposed thereon, the enlarged portions 123 of the bumps 120 may function as latches to increase a bonding strength between the bumps 120 and the interconnection portions 130. The bumps 120 may include, for example, a metal material or a metal alloy material. In an embodiment, the bumps 120 may include, for example, a gold (Au) material or a copper (Cu) material.

Each of the interconnection portions 130 may include a locking portion 131 substantially covering the bump 120, a ball landing portion 133 on which a solder ball 160 is disposed, and a connecting portion 135 for connecting the locking portion 131 to the ball landing portion 133. When the bumps 120 have a substantially hammer-shaped configuration or a 'T'-shaped configuration, the locking portion 131 may substantially cover or surround the enlarged portion 123 of the bump 120 and at least an upper portion of the post 121 (corresponding to a neck of the bump 120). The interconnection portions 130 may act as circuit interconnection lines of a package substrate such as, for example, a printed circuit board (PCB) or an embedded substrate. A solder resist layer 161 may be disposed to substantially cover the interconnection portions 130, and the ball landing portions 133 of the interconnection portions 130 may be in contact with the solder balls 160 penetrating the solder resist layer 161.

Each of the interconnection portions 130 may include a copper layer formed using a plating process. The locking portions 131 may be configured to contact the enlarged portions 123 of the bumps 120 and at least upper portions of the posts 121, as described above. Thus, contact areas between the bumps 120 and the locking portions 131 may be maximized to reduce electrical contact resistance there between, and the enlarged portions 123 of the bumps 120 may function as latches to increase a physical or mechanical bonding strength between the bumps 120 and the interconnection portions 130. Further, the enlarged portions 123 may chemically react on the locking portions 131 of the interconnection portions 130 to produce an inter-metallic compound material at interfaces between the enlarged portions 123 and the locking portions 131. Accordingly, the bumps 120 may be more strongly combined with the locking portions 131 of the interconnection portions 130 due to a chemical bonding strength in addition to the physical bonding strength.

In various embodiments, each of the interconnection portions 130 may include a copper layer formed using a deposition process which is different from a plating process. Alternatively, each of the interconnection portions 130 may include an aluminum layer, a gold layer, or an alloy material thereof, which may be used as interconnection lines of a package substrate.

The electronic device package may further include a first dielectric layer 140 that substantially surrounds the bumps 120 and the semiconductor chip 110, and separates the interconnection portions 130 from the semiconductor chip 110. The first dielectric layer 140 may encapsulate the semiconductor chip 110 to act as an embedding dielectric layer. Moreover, the electronic device package may further include a second dielectric layer 150 substantially covering the bottom surface 112 of the semiconductor chip 110. That is, the second dielectric layer 150 may protect the bottom surface 112 of the semiconductor chip 110 to act as a bottom dielectric layer. Additionally, the electronic device package may correspond to an embedded package including the semiconductor chip 110 completely surrounded by the first and second dielectric layers 140 and 150.

When the electronic device package is configured to substantially have an embedded package shape, the first dielectric layer 140 may include a resin material, and the resin material may contain glass fiber or filler. For example, the first dielectric layer 140 may include a resin layer that corresponds to a core layer of a printed circuit board (PCB). The second dielectric layer 150 may also include a resin material and may substantially have a panel board shape like, for example, a printed circuit board (PCB). The semiconductor chip 110 may be attached to a top surface 153 of the second dielectric layer 150 using an adhesive layer 115. That is, the adhesive layer 115 may be disposed between the semiconductor chip 110 and the second dielectric layer 150.

As illustrated in FIG. 2, when external terminals 163, for example, solder balls are disposed on a bottom surface 151 of the second dielectric layer 150 substantially opposite to the semiconductor chip 110, external interconnection portions 171 such as copper lines may be disposed between the solder balls 163 and the second dielectric layer 150. In such a case, the external terminals 163 may be electrically connected to the interconnection portions 130 through vias 173 penetrating the first and second dielectric layers 140 and 150, respectively. The bottom surface 151 of the second dielectric layer 150 may be substantially covered with a solder resist layer 162, and the solder balls 163 may penetrate the solder resist layer 162 to make contact with the external interconnection portions 171. Internal interconnection portions 175 may be disposed on the top surface 153 of the second dielectric layer 150 and the internal interconnection portions 175 may be substantially covered with the first dielectric layer 140. Each of the internal interconnection portions 175 may include a copper layer. The second dielectric layer 150 may be a printed circuit board (PCB) including the external interconnection portions 171 disposed on the bottom surface 151 thereof and the internal interconnection portions 175 disposed on the top surface 153 thereof.

In various embodiments, the vias 173 may be formed by stacking the first dielectric layer 140 on the second dielectric layer 150 in a laminated form, forming via holes penetrating the first and second dielectric layers 140 and 150, and substantially filling the via holes with portions of the interconnection portions 130 during a plating process for forming the interconnection portions 130. Alternatively, the vias 173 may be formed to penetrate the second dielectric layer 150, and the first dielectric layer 140 may be stacked on the second dielectric layer 150 to substantially surround sidewalls of the vias 173.

Although the above embodiments illustrated in FIGS. 1 and 2 are described in conjunction with the embedded packages, the inventive concept may be applicable to other packages. For example, the bonding or combining structure between the bump 120 having the enlarged portion 123 and the post 121 and the locking portion 131 surrounding the enlarged portion 123 and the post 121 may be applied even when the first dielectric layer 140 substantially covering the semiconductor chip 110 is formed of an epoxy molding compound (EMC) material or other resin materials.

FIGS. 3 to 13 are schematic drawings illustrating methods of manufacturing electronic device packages according to various embodiments.

Figure 3:
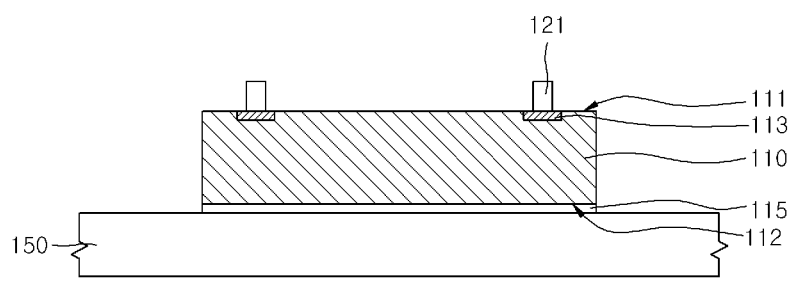
FIGS. 3 to 13 are schematic drawings illustrating methods of manufacturing electronic device packages according to various embodiments.
Figure 4:
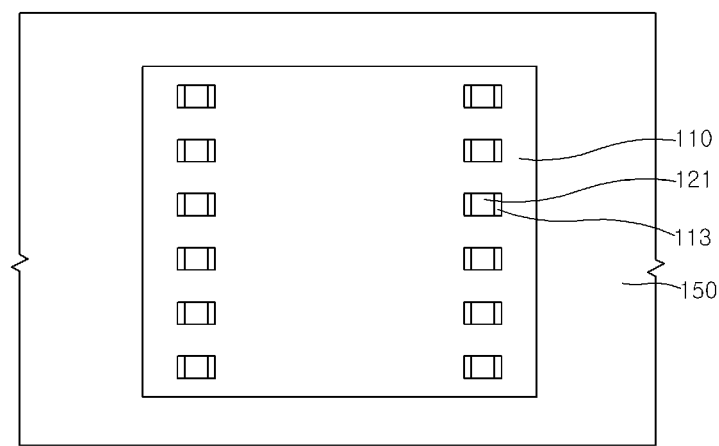

FIG. 3 is a cross sectional view illustrating a step of mounting a semiconductor chip 110 on a second dielectric layer 150, and FIG. 4 is a plan view of FIG. 3. Specifically, the semiconductor chip 110 may be attached to a top surface of the second dielectric layer 150 (acting as a bottom dielectric layer) using an adhesive layer 115. That is, the adhesive layer 115 may be disposed between the semiconductor chip 110 and the second dielectric layer 150. The second dielectric layer 150 may substantially have a panel board shape including the internal interconnection portions (175 of FIG. 2) and the external interconnection portions (171 of FIG. 2), as described with reference to FIG. 2. The semiconductor chip 110 may have contact portions 113 disposed at a top surface 111 thereof, as illustrated in FIGS. 1 and 2. Posts 121 may be arrayed on respective ones of the contact portions 113. After the posts 121 are disposed to contact the contact portions 113, the posts 121 may be bonded to or combined with the contact portions 113 using, for example, pressure, heat, and/or ultrasonic waves.

The posts 121 may be formed after the semiconductor chip 110 is mounted on the second dielectric layer 150, as described above. However, in various embodiments, the posts 121 may be formed on the contact portions 113 of the semiconductor chip 110 before the semiconductor chip 110 is mounted on the second dielectric layer 150. For example, the posts 121 may be formed on the contact portions 113 of a plurality of semiconductor chips formed on a wafer before the plurality of semiconductor chips are separated from each other using, for example, a die slicing process.

The posts 121 may be formed using a process for forming stud bumps. The process for forming stud bumps may be performed utilizing, for example, a wire bonding technique. Alternatively, the posts 121 may be formed using a process for forming metal posts. The process for forming metal posts may be performed utilizing, for example, a lithography process and a plating process. The metal posts may include, for example, copper pillar posts. However, the posts 121 may be formed of any one of various metal materials. In an embodiment, the posts 121 may be formed of gold bumps including a gold material or copper bumps including a copper material in consideration of a bonding reliability of the contact portions 113. The posts 121 may be formed to substantially have a stud shape. That is, the posts 121 may be formed to vertically extends or protrude from each contact portion 113. The posts 121 may substantially have a rectangular shape, as illustrated in a plan view of FIG. 4. However, the substantially planar shape of the posts 121 is not limited to the substantially rectangular shape. For example, the posts 121 may be formed to substantially have a circular shape or a polygonal shape in a plan view.

Figure 5:
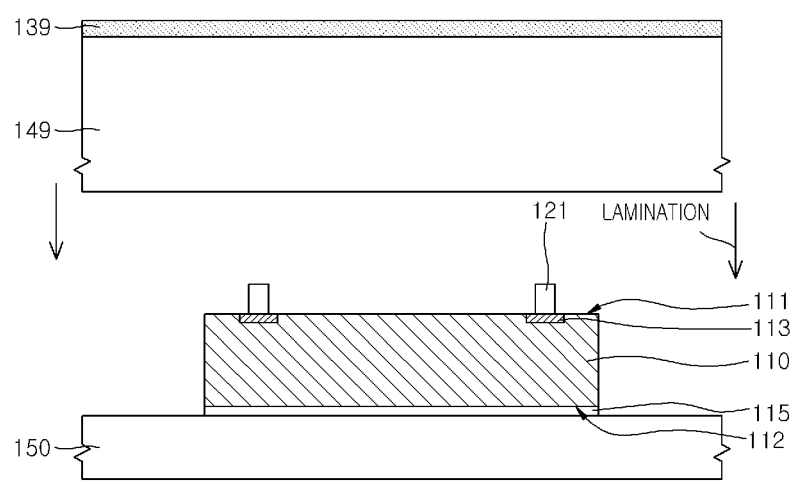

FIG. 5 is a cross sectional view illustrating a step of introducing a first dielectric film 149 onto the semiconductor chip 110. Additionally, the first dielectric film 149 may be disposed over the top surface 111 of the semiconductor chip 110. In various embodiments, a seed layer 139 may be attached to a top surface of the first dielectric film 149 before the first dielectric film 149 is disposed over the semiconductor chip 110. The seed layer 139 may help interconnection portions (130 of FIG. 1) to uniformly grow on first dielectric film 149 in a subsequent process. The seed layer 139 may be, for example, a copper foil. In various embodiments, the first dielectric film 149 may be disposed over the top surface 111 of the semiconductor chip 110 without the seed layer 139. In such a case, the seed layer 139 may be attached to a first dielectric layer after the first dielectric film 149 is laminated on the second dielectric layer 150 to form the first dielectric layer substantially covering the semiconductor chip 110.

Figure 6:
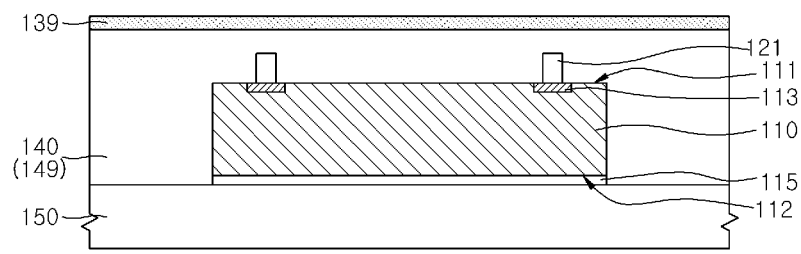

Referring to FIG. 6, the first dielectric film 149 may be laminated on the second dielectric layer 150, thereby forming a first dielectric layer 140 contacting and substantially covering the semiconductor chip 110 and the posts 121. Since each of the posts 121 substantially has a pillar shape, the posts 121 may be more readily infiltrated into the first dielectric film 149 during formation of the first dielectric layer 140. As a result, the semiconductor chip 110 and the posts 121 may be completely embedded in a dielectric layer including the first and second dielectric layers 140 and 150. In various embodiments, the first dielectric layer 140 may be formed without use of the laminating process. For example, the first dielectric layer 140 may be formed by molding or injecting a compound material.

Figure 7:
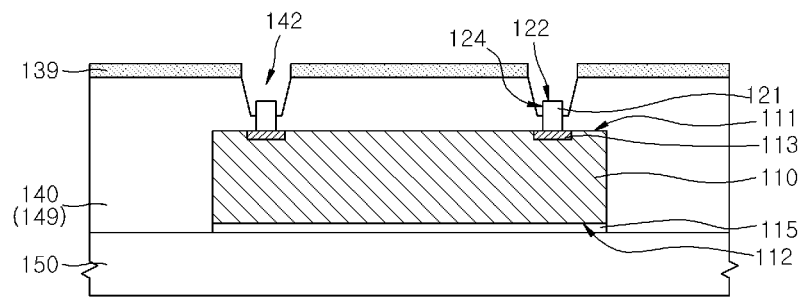

FIG. 7, is a cross sectional view illustrating a step of forming openings 142 in the first dielectric layer 140. Additionally, the seed layer 139 and the first dielectric layer 140 may be partially etched to form openings 142 that expose upper portions of the posts 121. The openings 142 may be formed to have a width which is greater than that of the posts 121. Thus, the openings 142 may be formed to expose top surfaces 122 and upper sidewalls 124 of the posts 121. The etching process for forming the openings 142 may be performed such that the contact portions 113 are not exposed. Thus, portions of the first dielectric layer 140 may remain under the openings 142.

Figure 8:
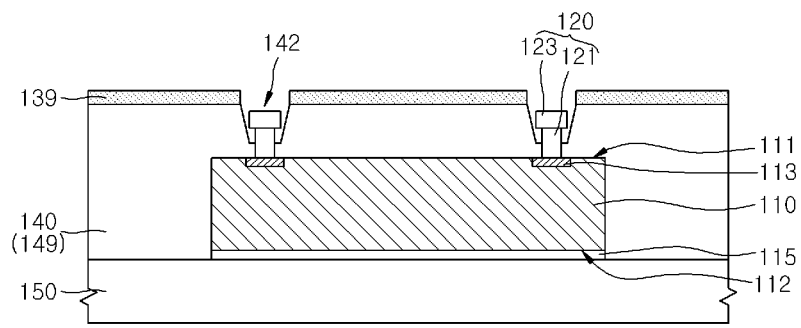
Figure 9:
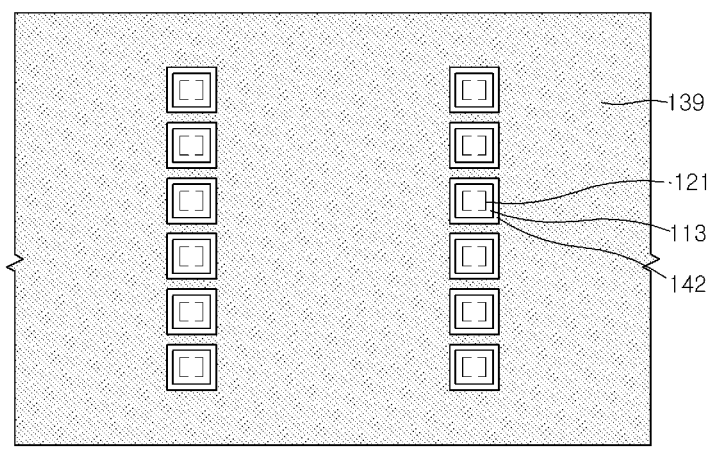

FIG. 8 is a cross sectional view illustrating a step of forming enlarged portions 123, FIG. 9 is a plan view of FIG. 8. Additionally, enlarged portions 123 may be combined with respective ones of the posts 121 exposed by the openings 142. One of the posts 121 and the enlarged portion 123 combined therewith may constitute a bump 120. A width of the enlarged portions 123 may be greater than that of the posts 121. Thus, edges of the enlarged portions 123 may laterally protrude from the posts 121. The enlarged portions 123 may be formed using a wire bonding process, as described with reference to FIGS. 10 and 12.

Figure 10:
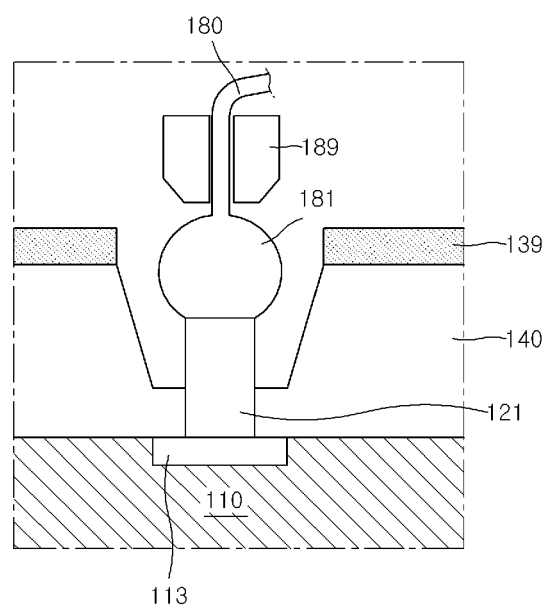

FIG. 10 is a cross sectional view illustrating a step of attaching a wire ball 181 to the post 121 of the bump 120 (illustrated in FIG. 8). Additionally, an electrical signal may be applied to a capillary 189 of a wire bonding apparatus, thereby transforming an end of a wire 180 inserted in the capillary 189 into a wire ball 181 substantially having a rounded shape. The wire 180 may be, for example, a gold wire or a copper wire. The wire ball 181 may be formed to have a diameter which is greater than a width of the post 121. The wire ball 181 may be attached and bonded to a top surface of the post 121.

Figure 11:
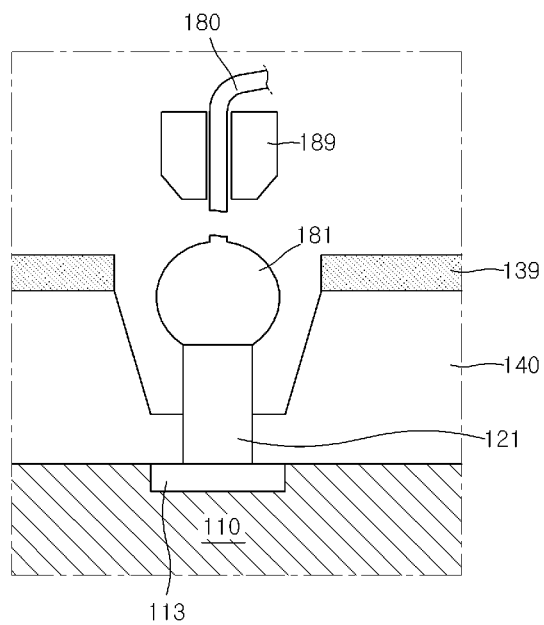

FIG. 11 is a cross sectional view illustrating a step of separating the wire ball 181 from the wire 180. Additionally, after the wire ball 181 is bonded to the post 121, an ultrasonic wave may be applied to the capillary 189 to cut the wire 180. As a result, the wire 180 may be separated from the wire ball 181 bonded to the post 121.

Figure 12:
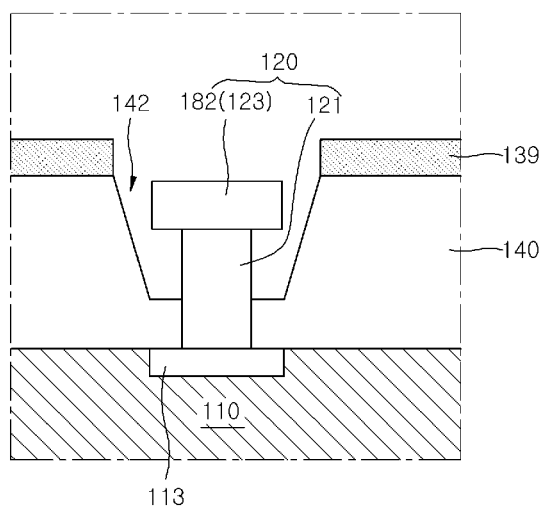

FIG. 12 is a cross sectional view illustrating a step of flattening the wire ball 181. Additionally, the wire ball 181 may be pressurized and flattened to form a substantially coin-shaped plate 182 corresponding to the laterally enlarged portion (123 of FIGS. 1 and 2). The post 121 and the enlarged portion 123 may constitute the bump 120 having a substantially hammer-shaped configuration or a 'T'-shaped configuration. Although a wire bonding technique is used in formation of the bump 120, other techniques may also be used in formation of the bump 120. For example, a micro bump having substantially the same shape as the enlarged flat portion 123 may be disposed on the post 121, and the micro bump and the post 121 may be bonded to or combined with each other to form the bump 120. The post 121 and the enlarged portion 123 may be formed of the same material to enhance the bonding reliability of the post 121 and the enlarged portion 123. For example, the post 121 and the enlarged portion 123 may be formed of a metal material containing gold or copper.

Figure 13:
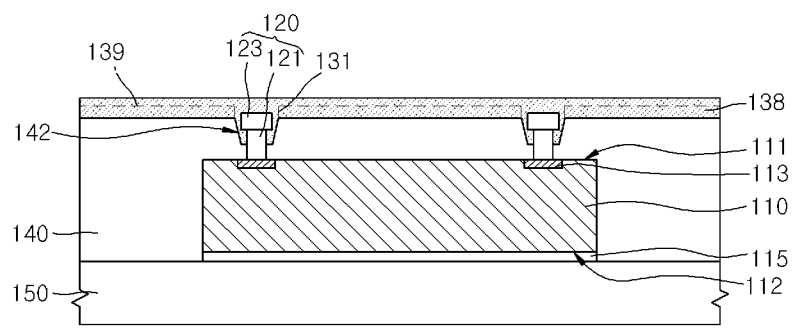

FIG. 13 is a cross sectional view illustrating a step of forming an interconnection layer 138. Additionally, after the bumps 120 are formed using substantially the same manners as described with reference to FIGS. 10, 11, and 12, a copper layer may be formed on the seed layer 139 using a plating process. The seed layer 139 and the copper layer thereon may constitute an interconnection layer 138. The interconnection layer 138 may be formed to include a copper plating layer which is widely employed in a printed circuit board (PCB). Alternatively, the interconnection layer 138 may be formed to include another metal material including, for example, aluminum, gold, or the like. In various embodiments, the interconnection layer 138 may be formed using a deposition process which is different from the plating process.

The interconnection layer 138 may be patterned to form interconnection portions 130 illustrated in FIGS. 1 and 2. Referring again to FIGS. 1 and 13, the openings 142 may be substantially filled with the interconnection layer 138 during formation of the interconnection layer 138. Thus, laterally protruded edges of the enlarged portions 123 may be substantially surrounded by locking portions 131 of the interconnection layer 138, thereby acting as latches. As a result, the bonding strength between the bumps 120 and the interconnection portions 130 may be increased because of the presence of the enlarged portions 123 constituting the bumps 120.

FIGS. 14 to 21 are cross sectional views illustrating methods of manufacturing electronic device packages according to various embodiments. In the previous and present embodiments, the same reference numerals or the same reference designators denote substantially the same elements. Thus, the explanations to the same elements as described in the previous embodiments will be omitted or briefly mentioned.

Figure 14:
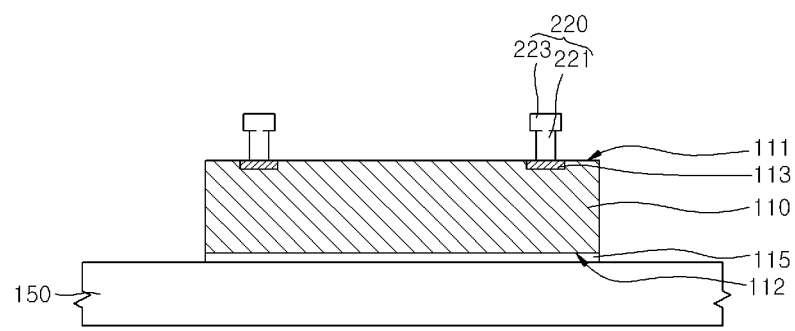
FIGS. 14 to 21 are cross sectional views illustrating methods of manufacturing electronic device packages according to various embodiments.

Referring to FIG. 14, bumps 220 may be formed on respective ones of contact portions 113 of a semiconductor chip 110, and the semiconductor chip 110 with the bumps 220 may be mounted on a second dielectric layer 150 using an adhesive layer 115. Each of the bumps 220 may be formed to include a post 221 and an enlarged portion 223 disposed on the post 221. The bumps 220 may be formed using the same or substantially the same manners as described with reference to FIGS. 15 to 18.

Figure 15:
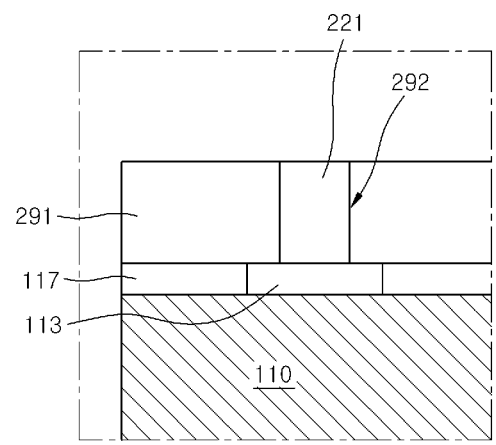

Referring to FIG. 15, an insulation layer 117 may be formed on the semiconductor chip 110 including contact portions 113. The insulation layer 117 may be formed to expose the contact portions 113. A first resist layer may then be formed on the insulation layer 117 and the contact portions 113. The first resist layer may be patterned using an exposure process and a developing process, thereby forming a first resist pattern 291. The first resist pattern 291 may be formed to have first holes 292 exposing the contact portions 113. The first resist layer may be formed by coating a photoresist layer on the insulation layer 117 and the contact portions 113, or by attaching a dry film to the insulation layer 117 and the contact portions 113. Alternatively, the first resist layer may be formed of a sacrificial layer which is different from the photoresist layer and the dry film.

Additionally, a conductive layer may substantially fill the first holes 292 to form the posts 221 in respective ones of the first holes 292. Thus, the posts 221 may be formed to have substantially the same shape as the first holes 292. The conductive layer may be formed using a deposition process, a plating process, or a pasting process. In various embodiments, the posts 221 may be formed in respective ones of the first holes 292 of a plurality of semiconductor chips formed on a wafer before the plurality of semiconductor chips are separated from each other using, for example, a die slicing process.

Figure 16:
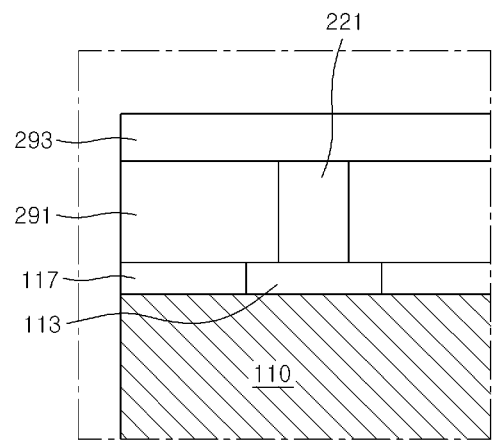

Referring to FIG. 16, a second resist layer 293 may be formed on the first resist pattern 291 and the posts 221. The second resist layer 293 may be formed by coating a photoresist layer on the first resist pattern 291 and the posts 221 or by attaching a dry film to the first resist pattern 291 and the posts 221. In various embodiments, the first resist pattern 291 may be removed before the second resist layer 293 is formed. In such a case, the second resist layer 293 may be formed to substantially cover sidewalls and top surfaces of the posts 221.

Figure 17:
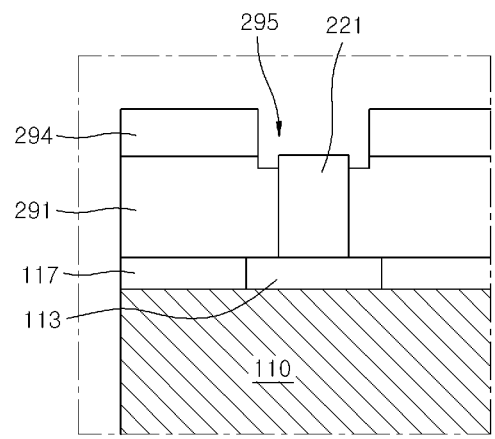

Referring to FIG. 17, the second resist layer 293 (see FIG. 16) may be patterned using an exposure process and a developing process, thereby forming a second resist pattern 294. The second resist pattern 294 may be formed to have second holes 295 exposing the posts 221. The second holes 295 may be formed to have a width which is greater than that of the posts 221. That is, the second holes 295 may expose top surfaces of the posts 221 and portions of the first resist pattern 291 substantially adjacent to the posts 221. In the event that the first resist pattern 291 is removed prior to formation of the second resist layer 293, the second holes 295 may be formed to expose the top surfaces and upper sidewalls of the posts 221 but not to expose the contact portions 113 and the insulation layer 117.

Figure 18:
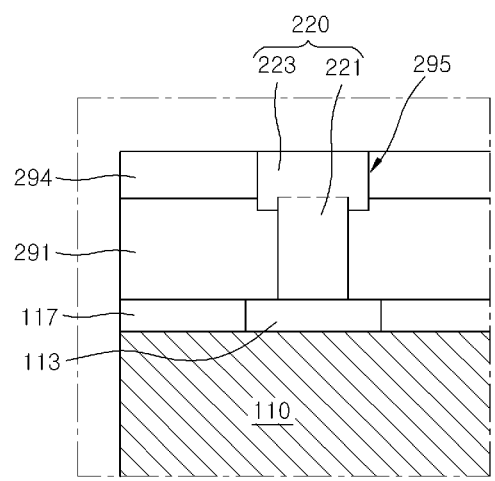

Referring to FIG. 18, a conductive layer may substantially fill the second holes 295 to form the enlarged portions 223 in respective ones of the second holes 295. Thus, the posts 221 may be formed to have substantially the same shape as the second holes 295. The conductive layer may be formed using, for example, a deposition process, a plating process, or a pasting process. Additionally, the first and second resist patterns 291 and 294, respectively, may be removed to expose sidewalls of the bumps 220 having substantially hammer-shaped configurations or 'T'-shaped configurations, as illustrated in FIG. 14.

As described above, the bumps 220 may be formed using the first and second resist patterns 291 and 194 as a template. However, in various embodiments, the enlarged portions 223 of the bumps 220 may be formed using the wire bonding process as described with reference to FIGS. 10, 11, and 12 after the posts 221 illustrated in FIG. 15 are formed. That is, the wire balls (181 of FIG. 10) may be formed on respective ones of the posts 221 using the wire bonding process, and the wire balls 181 on the posts 221 may be pressurized and flattened to form the laterally enlarged portions (182 of FIG. 12) corresponding to the enlarged portion 223. In various embodiments, the posts 221 may be formed using a stud bump formation technique that utilizes a wire bonding process.

Referring again to FIG. 14, after the semiconductor chip 110 on which the bumps 220 are formed is mounted on the second dielectric layer 150, the first and second resist patterns (291 and 294 of FIG. 18) used in formation of the bumps 220 may be removed to expose sidewalls of the bumps 220.

Figure 19:
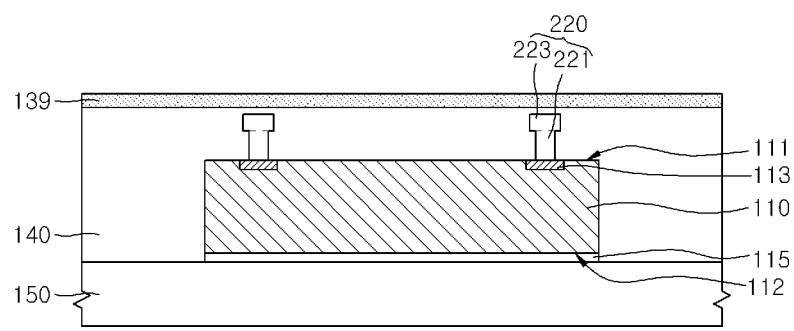

Referring to FIG. 19, after removal of the first and second resist patterns 291 and 294, respectively, a first dielectric layer 140 may be laminated on the second dielectric layer 150 using substantially the same manners as described with reference to FIGS. 5 and 6. As a result, the semiconductor chip 110 may be embedded in the first and second dielectric layers 140 and 150.

Figure 20:
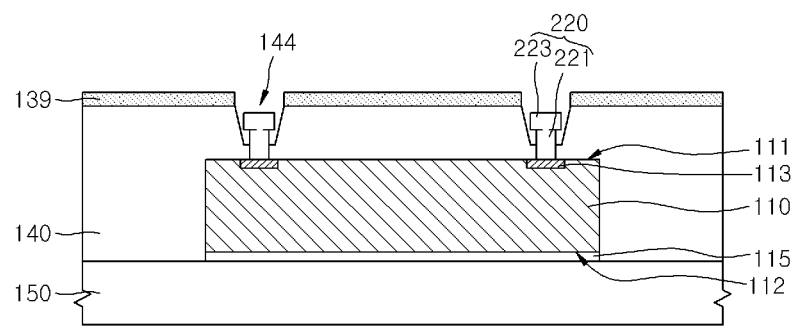

Referring to FIG. 20, the seed layer 139 and the first dielectric layer 140 may be partially etched to form openings 144 that expose top surfaces and upper sidewalls of the bumps 220. The openings 144 may be formed using substantially the same manners as described with reference to FIG. 7.

Figure 21:
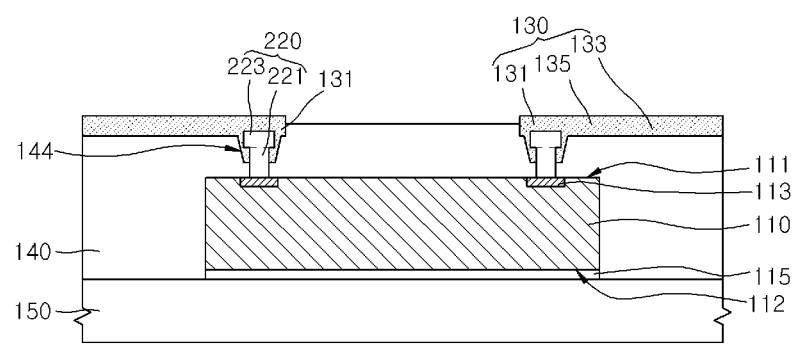

Referring to FIG. 21, an interconnection layer may be formed to substantially fill the openings 144, and the interconnection layer may be patterned to form interconnection portions 130. The interconnection layer may be formed using substantially the same manners as described with reference to FIG. 13.

According to the embodiments set forth above, each of bumps on a semiconductor chip may be formed to have a substantially hammer-shaped configuration or a 'T'-shaped configuration, and the bumps may be substantially surrounded by interconnection portions. Thus, a bonding strength between the bumps and the interconnection portions may be increased to suppress the interconnection portions from lifting from the bumps.

The various embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A method of manufacturing an electronic device package, the method comprising:
   forming a first dielectric layer that substantially surrounds a semiconductor chip having a contact portion, the first dielectric layer having an opening that exposes an upper sidewall of a post disposed on the contact portion and exposes an enlarged portion laterally protruded from an upper portion of the post; and
   forming an interconnection portion including a locking portion that substantially surrounds the enlarged portion and the exposed upper sidewall of the post,
   wherein the post and the enlarged portion constitute a bump and the interconnection portion is formed to extend onto the first dielectric layer.

2. The method of claim 1, further comprising mounting the semiconductor chip onto a second dielectric layer prior to formation of the first dielectric layer.

3. A method of manufacturing an electronic device package, the method comprising:
   forming a post on a contact portion of a semiconductor chip;
   forming a first dielectric layer substantially covering the semiconductor chip;
   removing a portion of the first dielectric layer to form an opening that exposes an upper portion and an upper sidewall of the post;
   forming an enlarged portion that is disposed on the post to laterally protrude from the upper sidewall of the post so that the upper sidewall of the post is exposed below the enlarged portion; and
   forming an interconnection portion on the first dielectric layer,
   wherein the interconnection portion is formed to have a locking portion that substantially fills the opening to substantially surround the enlarged portion and the exposed upper sidewall of the post, and the post and the enlarged portion constitute a bump and the interconnection portion is formed to extend onto the first dielectric layer.

4. The method of claim 3, further comprising mounting the semiconductor chip on a second dielectric layer prior to formation of the post.

5. The method of claim 3, further comprising mounting the semiconductor chip with the post on a second dielectric layer prior to formation of the first dielectric layer.

6. The method of claim 3, wherein forming the enlarged portion includes:
   attaching a ball to a top surface of the post using a wire bonding apparatus;
   separating the ball from a wire produced by the wire bonding apparatus; and
   flattening the ball.

7. The method of claim of claim 3, wherein forming the interconnection portion includes forming a conductive layer that substantially fills the opening using a plating process.

8. The method of claim of claim 3, wherein forming the first dielectric layer includes laminating a dielectric film on the semiconductor chip.

9. The method of claim of claim 8, further comprising laminating a seed layer having a foil form on the dielectric film after the dielectric film is laminated on the semiconductor chip.

10. The method of claim 3, wherein forming the first dielectric layer includes:
    disposing a dielectric film with a seed layer over the semiconductor chip; and
    laminating the dielectric film on the semiconductor chip.

11. The method of claim of claim 3, wherein forming the interconnection portion includes:
    forming a conductive layer substantially filling the opening on the first dielectric layer using a plating process; and
    patterning the conductive layer.

12. The method of claim of claim 3, wherein the bump is formed to include a first metal material and the interconnection portion is formed to include a second metal material different from the first metal material.

13. A method of manufacturing an electronic device package, the method comprising:
    forming a bump having a post disposed on a contact portion of a semiconductor chip and an enlarged portion laterally protruded from an upper portion of the post;
    forming a dielectric layer on the semiconductor chip;
    removing a portion of the dielectric layer to form an opening that exposes the enlarged portion and an upper sidewall of the post under the enlarged portion; and
    forming an interconnection portion on the dielectric layer,
    wherein the interconnection portion is formed to have a locking portion that substantially fills the opening to substantially surround the enlarged portion and the exposed upper sidewall of the post and the interconnection portion is formed to extend onto the first dielectric layer.

14. The method of claim 13, wherein forming the bump includes:
    forming the post on the contact portion of the semiconductor chip;
    attaching a ball to a top surface of the post using a wire bonding apparatus;
    separating the ball from a wire produced by the wire bonding apparatus; and
    flattening the ball to form the enlarged portion.

15. The method of claim 13, wherein forming the bump includes:
    forming a first resist pattern on the semiconductor chip, the first resist pattern being formed to have a first hole exposing the contact portion of the semiconductor chip;
    filling the first hole with a conductive layer to form the post;
    forming a second resist layer on the post;

patterning the second resist layer to form a second hole that exposes the post and has a greater width than the post; and filling the second hole with a conductive layer to form the enlarged portion.

* * * * *